(12) United States Patent
Dal Toso et al.

(10) Patent No.: US 11,979,157 B2
(45) Date of Patent: May 7, 2024

(54) SINGLE-ENDED TO DIFFERENTIAL SIGNAL CONVERTER, AND SIGNAL CONVERTING METHOD

(71) Applicant: NXP B.V., Eindhoven (NL)

(72) Inventors: Stefano Dal Toso, Antibes (FR); Olivier Susplugas, Cambes en Plaine (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 18/061,674

(22) Filed: Dec. 5, 2022

(65) Prior Publication Data
US 2023/0246635 A1 Aug. 3, 2023

(30) Foreign Application Priority Data

Jan. 31, 2022 (EP) ..................................... 22305105

(51) Int. Cl.
*G06F 1/06* (2006.01)
*G06F 1/08* (2006.01)
*H03K 3/356* (2006.01)
*H03K 5/24* (2006.01)

(52) U.S. Cl.
CPC ........... *H03K 3/35613* (2013.01); *G06F 1/06* (2013.01); *G06F 1/08* (2013.01); *H03K 5/2481* (2013.01)

(58) Field of Classification Search
CPC ..... G06F 1/04; G06F 1/06; G06F 1/08; G06F 1/10; H03K 3/35613; H03K 5/2481; H03K 5/00006; H03K 19/20; H03K 19/21; H03K 21/02; H03K 21/023; H03K 21/026; H03K 21/08; H03K 21/10
See application file for complete search history.

(56) References Cited

U.S. PATENT DOCUMENTS

| 6,433,595 | B1 * | 8/2002 | Tung ....................... G06F 30/30 327/218 |
| 6,686,787 | B2 * | 2/2004 | Ling ................ H03K 3/356043 327/217 |
| 2020/0076377 | A1 | 3/2020 | Yoshikawa |

FOREIGN PATENT DOCUMENTS

| CN | 113726335 A | 11/2021 |
| JP | 5471427 B2 | 4/2014 |
| KR | 100247912 B1 * | 3/2000 ............... H03K 5/00 |

OTHER PUBLICATIONS

Staszewski, R., "1.3 V 20 ps time-to-digital converter for frequency synthesis in 90-nm CMOS", IEEE Transactions on Circuits and Systems II: Express Briefs, vol. 53, Issue 3, Mar. 2006.
Welp, B., "A 1-30 GHz 3-Bit Vector Modulator Based on Ultra-Wideband IQ-Generation for MIMO-Radar-Systems in SiGe BiCMOS", 2017 IEEE Radio Frequency Integrated Circuits Symposium (RFIC), Jun. 4-6, 2017.

* cited by examiner

*Primary Examiner* — Long Nguyen

(57) ABSTRACT

It is described a signal converter device (100) for converting a single-ended signal to a differential signal, the device (100) comprising:
i) a multiplier device (110), configured to
receive a single-ended incoming signal (105), and
multiply the incoming signal (105) to provide a multiplied signal (115); and
ii) a divider device (120), configured to
receive the multiplied signal (115), and
divide the multiplied signal (115) to provide a differential signal (125a, 125b).
Further, a corresponding signal conversion method is described.

16 Claims, 4 Drawing Sheets

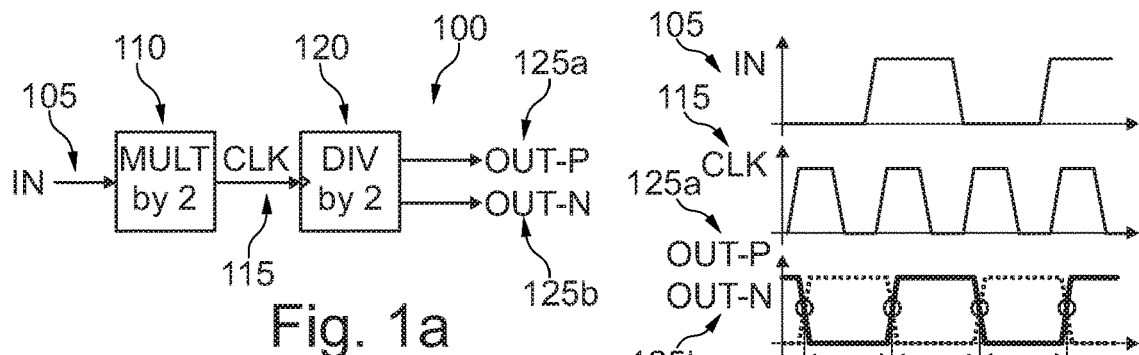
Fig. 1a
Fig. 1b
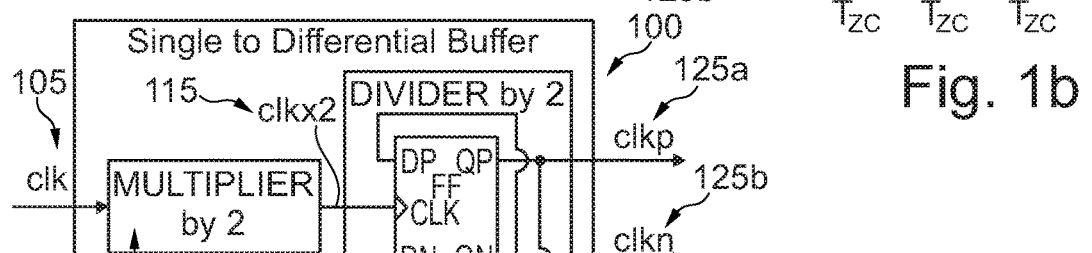
Fig. 2a
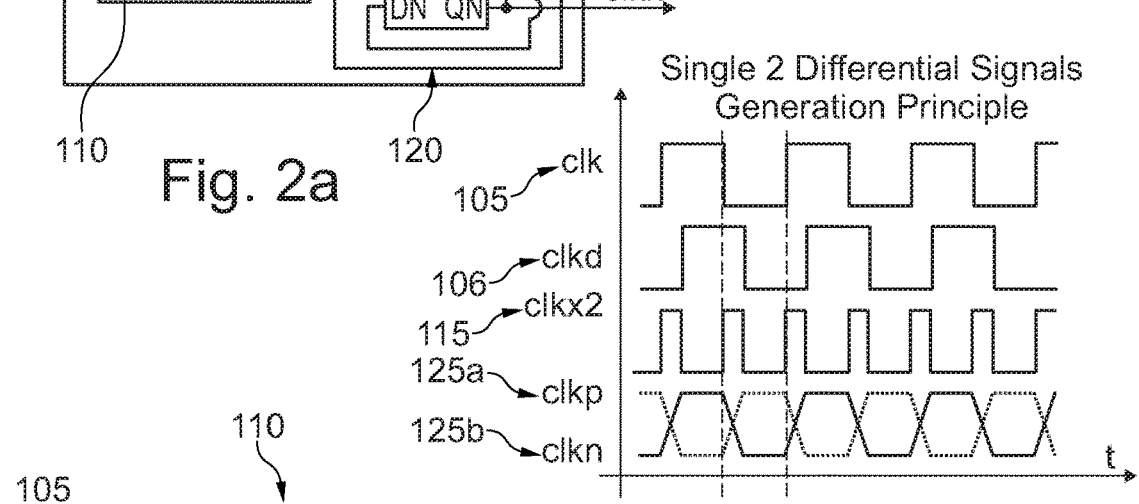
Fig. 2b
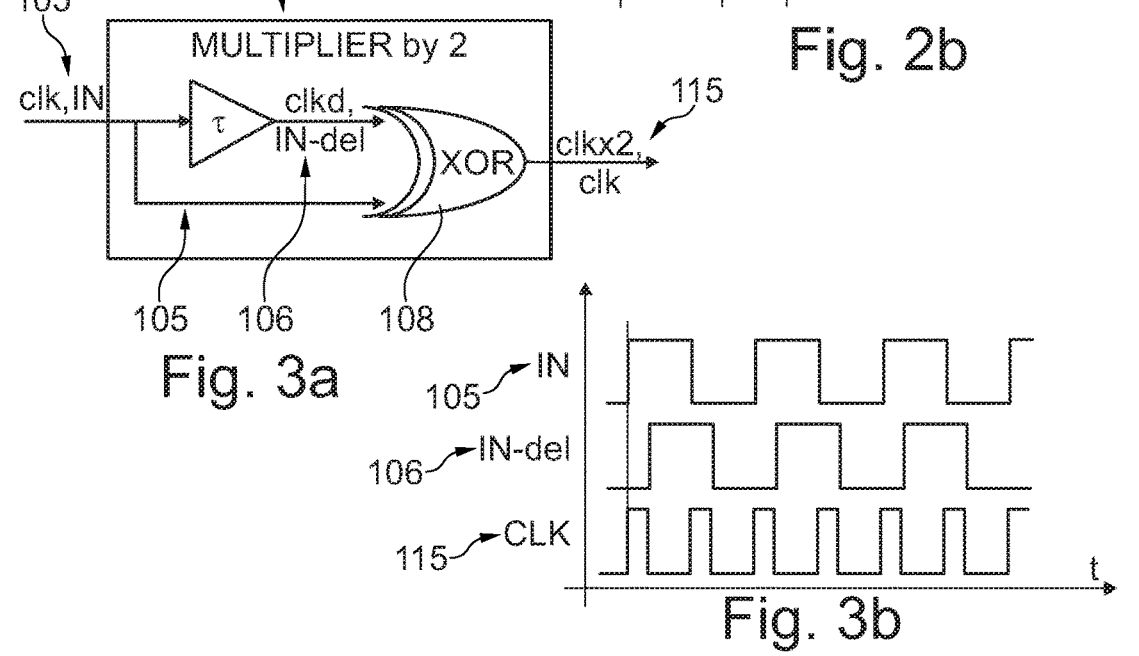
Fig. 3a
Fig. 3b

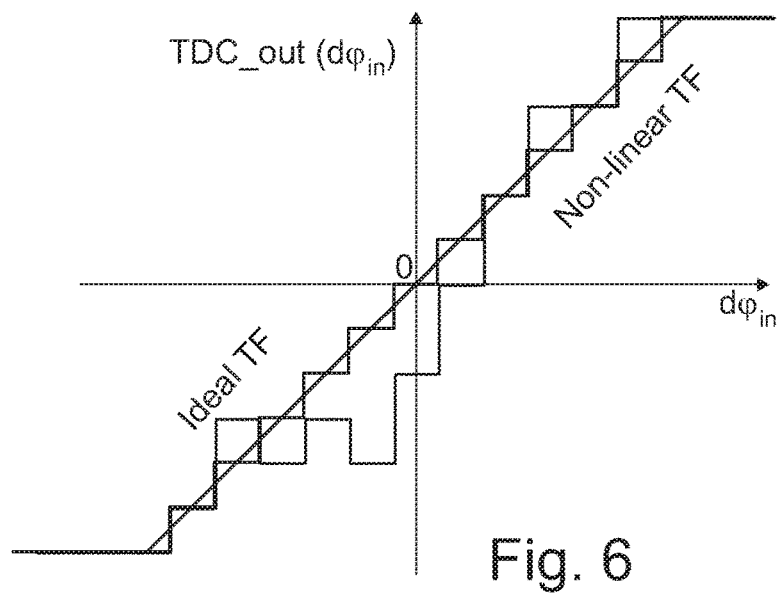
Fig. 6
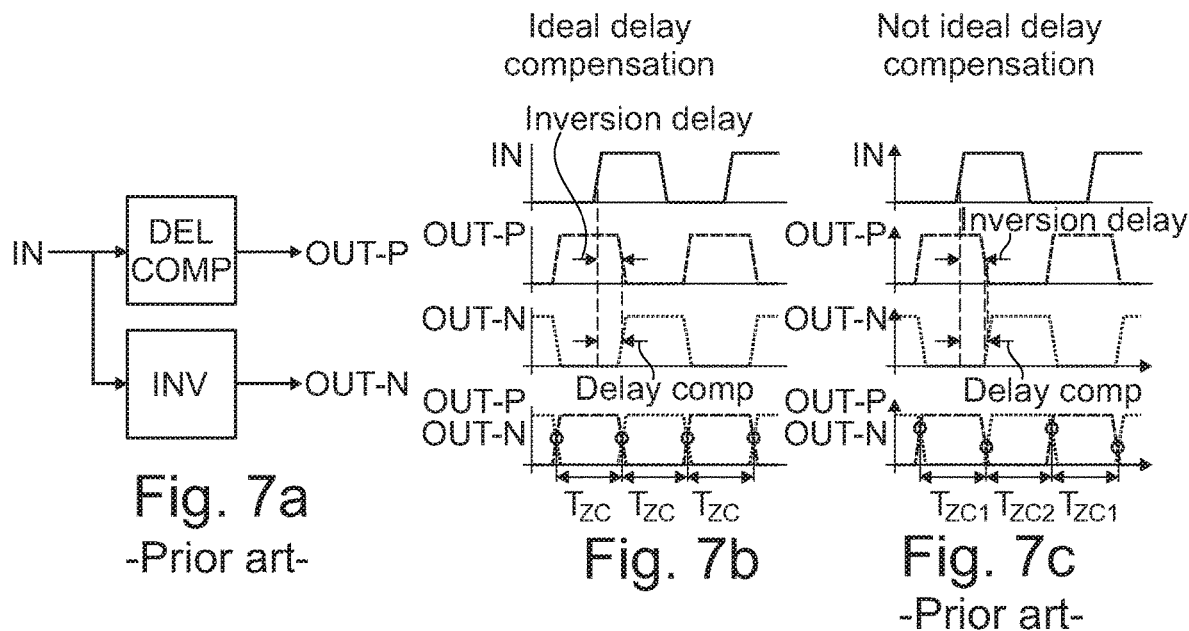
Fig. 7a
-Prior art-
Fig. 7b
Fig. 7c
-Prior art-
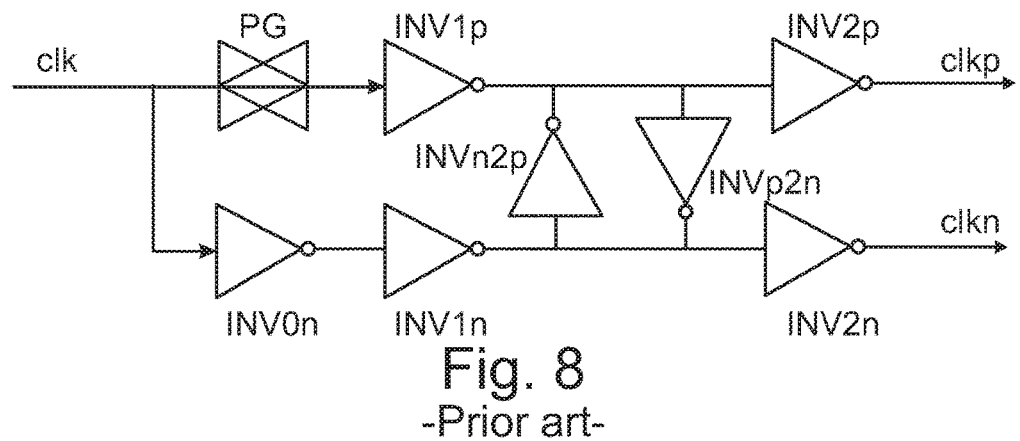
Fig. 8
-Prior art-

SINGLE-ENDED TO DIFFERENTIAL SIGNAL CONVERTER, AND SIGNAL CONVERTING METHOD

CROSS-REFERENCE TO RELATED APPLICATIONS

This application claims the priority under 35 U.S.C. § 119 of European Patent application no. 22305105.3, filed on 31 Jan. 2022, the contents of which are incorporated by reference herein.

TECHNICAL FIELD

The present disclosure relates to a signal converter device for converting a single-ended signal to a differential signal. Further, the present disclosure relates to a method of converting a single-ended signal to a differential signal. Thus, the present disclosure may refer to the technical field of signal conversion and signal processing.

TECHNICAL BACKGROUND

A signal converter is a device that is configured to convert a first signal into a second signal, being different from the first signal. For example, a signal converter can be configured to convert a single-ended signal into a differential signal.

A Time to Digital Converter (TDC) is a device that quantifies the phase difference between an incoming signal S(t) and a reference signal Ref(t). In most of applications both, S(t) and Ref(t), are single-ended signals. Nevertheless, a differential incoming signal can permit an improved TDC performance in term of linearity and resolution. Many TDC implementations rely on a single-ended to differential signal converter to convert the single-ended incoming (CMOS) clock signal to a differential signal. However, such a single-ended to differential converter can again become a bottleneck for the TDC performance, due to a potentially low linearity and accordingly low Zero-Crossing (ZC) stability (ZC properties) of the single-ended to differential converter.

Due to non-idealities of the design (and especially due to non-stable ZC properties), the transfer function (TF) of the TDC can be non-linear, lowering or degrading the PLL or system performances in which the TDC is used (see FIG. 6).

Conventionally, the complementary phases of the differential signal are generated by inverting the incoming single-ended signal. The delay introduced by the inverting circuit is then compensated to guarantee stable ZC properties between the differential phases. Even though many different delay compensation techniques have been described, the compensation has not been ideal, leading to inaccurate ZC properties of the differential signal.

FIG. 7a shows a conventional example, wherein the complementary phases of the differential signal are generated by inverting the input signal and compensating for the inversion delay. However, if the delay compensation is not ideal, the zero crossings of the differential signal are modulated. In case of ideal delay compensation, the zero crossing are equally spaced, with period TZC (see FIG. 7b). In case of not ideal compensation (which occurs for the conventional example), the zero crossing properties are not equally time spaced (TZC1≠TZC2), as can be seen in FIG. 7c.

FIG. 8 shows a conventional approach in more detail, wherein differential signals are generated rail-to-rail. Inverters are coupled in series, and the opposite signal phase is built by inverting the input with an additional inverter (INVOn). Since the two paths are not symmetrical, a stable differential output ZC at half of the supply voltage is difficult to obtain. To stabilize the output ZC, it is further required to fine-tune the components of each path. A pass-gate (PG) can be used in series in the path lacking one inverter to balance the signals propagation speed. Further, in this example, additional resynchronization inverters INVp2n and INVn2p are used to force the two paths to work in phase opposition. Nevertheless, non-symmetries remain and the ZC properties of the differential outputs are still sensitive to process and mismatches.

OBJECT AND SUMMARY OF THE DISCLOSURE

There may be a need to convert a single-ended signal to a differential signal in an efficient and robust manner, in particular with highly stable zero-crossing properties. A device and a method according to the independent claims are described in the following. Exemplary embodiments are described by the dependent claims.

According to an aspect of the present disclosure, there is described a signal converter device (for example being configured as or being part of a time-to-digital converter) for converting a single-ended signal (e.g. a clock signal) to a differential signal, the device comprising:
i) a (frequency) multiplier device (e.g. a multiplier circuit), configured to
ia) receive a single-ended incoming signal, and
ib) multiply the incoming signal (frequency) (in particular by two) to provide a multiplied signal (frequency) (i.e. a signal whose frequency is multiplied); and
ii) a (frequency) divider device (in particular a differential device, more in particular a fully symmetrical differential device), configured to
iia) receive the multiplied signal, and
iib) divide the multiplied signal (in particular by two) to provide a differential signal (a differential signal comprises two complementary signal phases). In particular, the factor of the multiplication and the division is the same, more in particular two.

According to an aspect of the present disclosure, there is described a method of converting a single-ended signal to a differential signal, the method comprising:
i) receiving a single-ended incoming signal;
ii) multiplying the incoming signal (frequency) to provide a multiplied signal (frequency); and subsequently
iii) dividing the multiplied signal to provide a differential signal.

According to an exemplary embodiment of the present disclosure, a single-ended signal may be converted to a differential signal in an efficient and robust manner (in particular with a highly stable zero-crossing output), when the single-ended input signal frequency is multiplied and subsequently divided (in particular based on a symmetrical system) to provide a differential output signal. This approach may overcome limitations of the prior art by having an optimized symmetry of the path that generates the differential signal(s). In particular, there may be no need to invert any signal or to compensate any delay, because the differential signal generation with high ZC precision may be guaranteed by the signal converter design (in particular the ideal symmetrical structure).

Conventionally, several tricks are applied in order to compensate for consequences of non-symmetries of a single-to-differential converter (see also discussion further above). In contrast to these complex and error-prone approaches, it is described here for the first time a simple and easy-to-implement approach that is at the same time a true symmetrical design that reliably provides differential signals with a highly stable zero-crossing output.

The described approach may be efficiently applied in different electronic applications that relate to signal conversion. In particular, the linearity of a time-to-digital converter may be significantly improved.

DESCRIPTION OF EXEMPLARY EMBODIMENTS

In the following, further exemplary embodiments of the device and the method will be explained.

According to an embodiment, the multiplier device is configured to multiply by two and/or a multiple of two (the input signal frequency). In the present context, the term multiplier device may refer to any circuit that is configured to multiply an incoming (clock) signal (frequency). The term multiple of two may refer to a product of the number two and a further natural number. Thus, the multiple of two may be for example be four, six, eight, etc.

According to a further embodiment, the divider device is configured to divide by two and/or the multiple of two. In the present context, the term divider device may refer to any circuit that is configured to divide an incoming (clock) signal and thereby providing a differential signal. In an example, a divider device may be a symmetrical differential device. In a further example, the number of multiplication and division is the same.

According to a further embodiment, at least one of the incoming signal, the multiplied signal, and the differential signal is a clock signal.

According to a further embodiment, the multiplication is a frequency multiplication. According to a further embodiment, the division is a frequency division. In particular, the frequency of the single ended incoming signal and the differential output signal is the same.

According to a further embodiment, the multiplier device is further configured to provide a delayed incoming signal of the incoming signal, and include the delayed incoming signal in the multiplication. Thereby, a reliable multiplication operation may be established.

According to a further embodiment, the multiplier device further comprises an XOR-gate, wherein the input to the XOR-gate comprises the incoming signal and the delayed incoming signal, and wherein the output of the XOR-gate comprises the multiplied signal.

According to a further embodiment, the divider device comprises a differential flip-flop circuit, in particular a differential symmetrical flip-flop circuit. In this manner, the implementation may be straightforward using tested and established devices. The symmetrical design may in particular lead to a highly stable ZC output.

According to a further embodiment, the device is at least partially configured in CMOS. Thereby, the described concept may be implemented in an established and robust environment.

According to a further embodiment, the signal converter device further comprises a synchronizer device (in particular coupled between the multiplier device and the divider device), and configured to i) provide a preset signal, and ii) synchronize at least one of the multiplied signal and the differential signal with respect to the preset signal. In an example, if no care is applied, the initial phase of some symmetrical divider implementation is unknow (it depends on the mismatch of some divider components). Hereby, implementing a preset function that forces the initial state of the divider outputs can solve this issue.

According to a further embodiment, the device further comprises a combiner (e.g. an, AND-gate), coupled in between the multiplier device and the divider device, wherein the synchronizer device is configured to provide a synchronization signal to the combiner to generate a synchronized multiplied signal. This implementation may be efficient to couple the preset signal into the multiplier-divider path.

According to a further embodiment, there is provided a time-to-digital converter that comprises the device as described above. By achieving a highly stable ZC output, linearity of the TDC may be improved.

BRIEF DESCRIPTION OF THE DRAWINGS

FIG. 1a illustrates a signal converter device and FIG. 1b illustrates the corresponding signals according to an exemplary embodiment of the present disclosure.

FIG. 2a illustrates a signal converter device in more detail and FIG. 2b illustrates the corresponding signals according to an exemplary embodiment of the present disclosure.

FIG. 3a illustrates a multiplier device and FIG. 3b illustrates the corresponding signals according to an exemplary embodiment of the present disclosure.

FIG. 5a illustrates a basic implementation of the divider device, while

FIG. 6 illustrates a highly stable zero-crossing output according to an exemplary embodiment of the present disclosure in comparison with a conventional output.

FIGS. 7a and 7c illustrate a prior art conversion device with the corresponding signals, while FIG. 7b illustrates the signals of a signal conversion device according to an exemplary embodiment of the present disclosure.

FIG. 8 illustrates a conventional approach for signal conversion.

DETAILED DESCRIPTION OF THE DRAWINGS

Figure 4A:
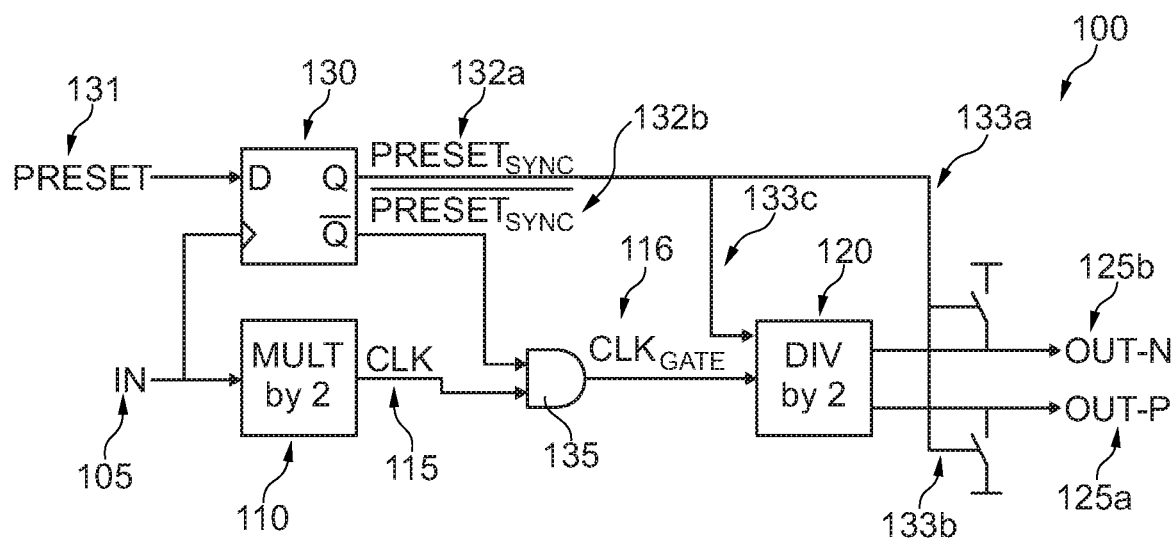
FIG. 4a illustrates a signal converter device with a synchronization device and FIG. 4b illustrates the corresponding signals according to an exemplary embodiment of the present disclosure.

Before referring to the drawings, exemplary embodiments will be described in further detail, some basic considerations will be summarized based on which exemplary embodiments of the present disclosure have been developed.

According to an exemplary embodiment of the present disclosure, there is generated a differential signal by a fully differential sense-amplifier-based D-flip-flop which is used as a frequency divider by two. It requires then in-front a frequency multiplier by two, that receives the single-ended input signal, and provides a clock signal multiplied by two. Since the proposed approach does not rely on an inversion to generate the complementary phase, there is no additional delay which would have to be compensated. Thereby, the accuracy of a differential signal ZC precision is guaranteed by construction.

According to an exemplary embodiment of the present disclosure, there is described the usage of a differential frequency divider by two (e.g a differential flip-flop) with a frequency multiplier by two in front. A single-ended signal goes to the frequency multiplier by two, and the multiplier output signal is fed to a fully-differential frequency divider by two. The output of the fully differential divider is a differential signal at the same frequency as the original single-ended signal. Due to the fully differential implementation of the divider device, the two differential signal phases are exactly 180 degrees apart.

According to an exemplary embodiment of the present disclosure, a differential CMOS clock is generated by frequency multiplying by two the single-ended input signal, while the multiplied by two signal is then used as a clock for a differential (symmetrical) divide by two circuit. The output of the divider by two is the desired differential signal, which is differential by construction.

FIG. 1a illustrates a signal converter device 100 according to an exemplary embodiment of the present disclosure. The signal converter device 100 is configured for converting a single-ended input signal 105 into a differential signal 125. The device 100 comprises a multiplier device 110, configured to receive the single-ended incoming signal 105, and to multiply the incoming signal 105 by two to provide a multiplied signal 115. The device 100 further comprises a divider device 120 downstream of the multiplier device 110, and configured to receive the multiplied signal 115 from the multiplier device 110, and divide the multiplied signal 115 by two to provide the differential signal 125. The differential signal 125 comprises hereby two complementary phases 125a, 125b.

FIG. 1b illustrates examples of the signals that correspond to the above described signal converter device 100. The multiplied signal 115 (CLK) is double with respect to the incoming signal 105 (IN), while the differential signal 125 is again half of the multiplied signal 115. It can be seen that the two complementary phases 125a, 125b (OUT-P and OUT-N) of the differential signal 125 show perfect zero-crossing properties (see added circles).

FIG. 2a illustrates a signal converter device 100 as described for FIG. 1a above, but in more detail according to an exemplary embodiment of the present disclosure. In this example, the divider device 120 is implemented as a differential symmetrical flip-flop device.

FIG. 2b illustrates examples of the signals that correspond to the above described signal converter device 100. Like in the case of FIG. 1b, the differential signal 125 shows perfect zero-crossing properties. The delayed input signal clkd is described below. The rising edges of the multiplied signal 115 (clkx2) are built with the input signal 105 (clk), which provides a more efficient noise suppression. In this example, only the rising edge is built with the input signal 105, while the falling edge is built with the delayed signal 106. Hereby, only the rising edge is important for noise suppression because the divider 120 is clocked on the rising edge of the multiplied signal 115. Each edge of the divider by two outputs (differential signal 125) is built with a rising edge of the multiplied signal 115 (clkx2).

FIG. 3a illustrates a multiplier device 110 according to an exemplary embodiment of the present disclosure. The multiplier device 110 comprises a delay-circuit that provides a delayed incoming signal 106 with respect to the incoming signal 105. When performing the multiplication, the incoming signal 105, as well as the delayed incoming signal 106, are taken into account. Specifically, in this example, there is provided an OR-gate 108, wherein the input to the OR-gate 108 comprises the incoming signal 105 and the delayed incoming signal 106. As a consequence, the output of the OR-gate 108 comprises the multiplied signal 115. The accuracy of the delay t is not important in this example. It only defines the accuracy of the falling edge of the clock signal (clk), while the divider device 120 is positive edge triggered (or vice versa).

FIG. 3b illustrates examples of the signals that correspond to the above described multiplier device 110.

FIG. 4a illustrates a signal converter device 100 with a synchronization device 130 according to an exemplary embodiment of the present disclosure. The synchronizer device 130 is configured to provide a plurality of synchronization signals 132a, 132b based on an incoming preset signal 131. The synchronization device 130 determines a difference between the incoming signal 105 and the preset signal 131 and provides, based on the result, a first synchronization signal 132a to the differential signal 125, and a second synchronization signal 132b to the multiplied signal 115. Regarding the first synchronization signal 132a, this is divided into two further first synchronization signals 133a,b each of which is applied to synchronize one of the complementary phases 125a, 125b of the differential signal 125. The second synchronization signal 132b is compared/combined with the multiplied signal 115 at a combiner device, e.g. an AND-gate (135), to provide a synchronized multiplied signal 116. The preset release of divider device 120 is synchronized to the input clock by a third synchronization signal 133c.

Figure 4B:
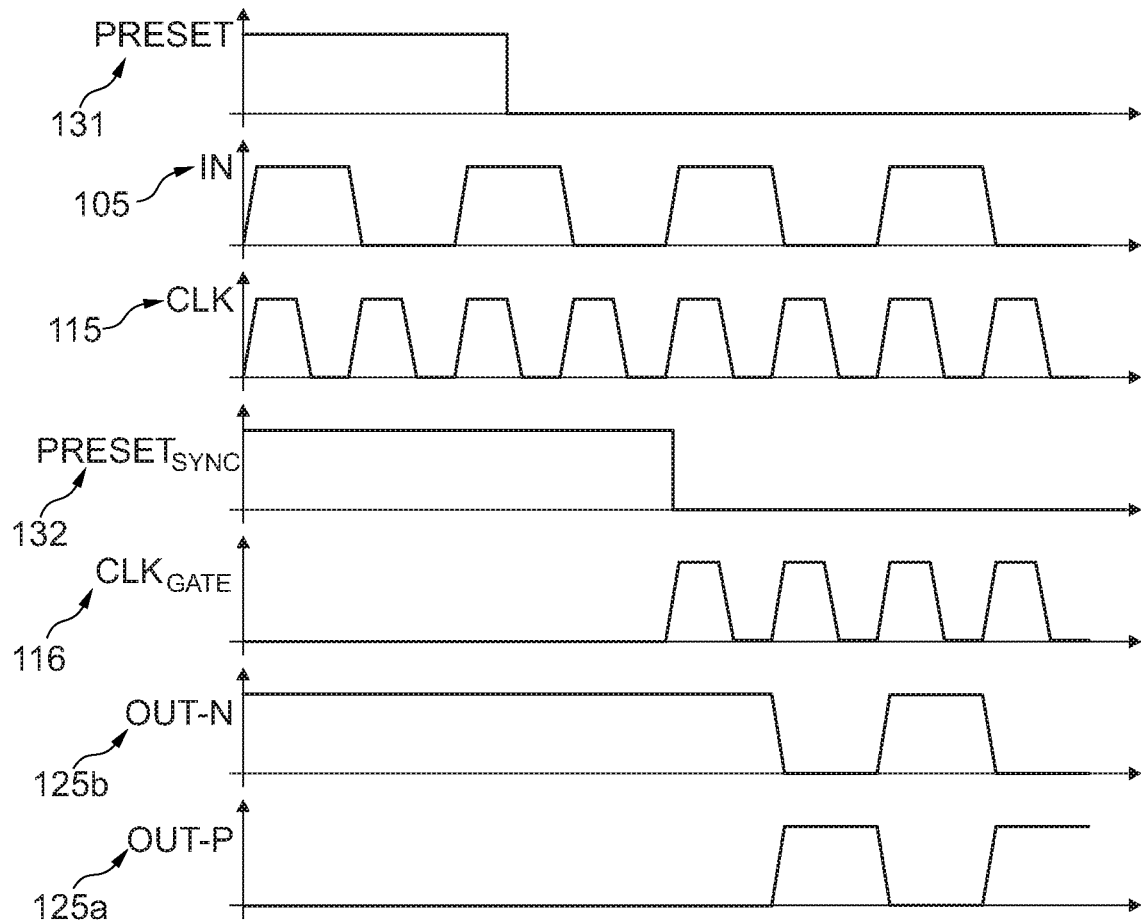

FIG. 4b illustrates the signal of the above described signal converter device 100 with the synchronizer device 130. Based on the preset synchronization signal 131, the synchronized multiplied signal 116 and the synchronized differential signal phases 125a, b will be truncated at an initial signal sequences.

Figure 5A:
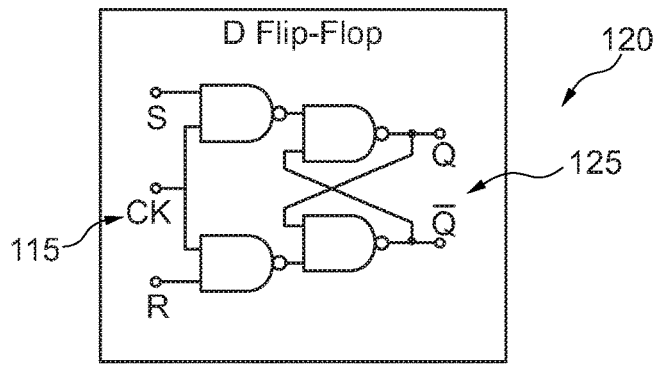

FIG. 5a illustrates a basic implementation of the divider device 120 using a differential symmetrical flip-flop circuit according to an exemplary embodiment of the present disclosure.

Figure 5B:
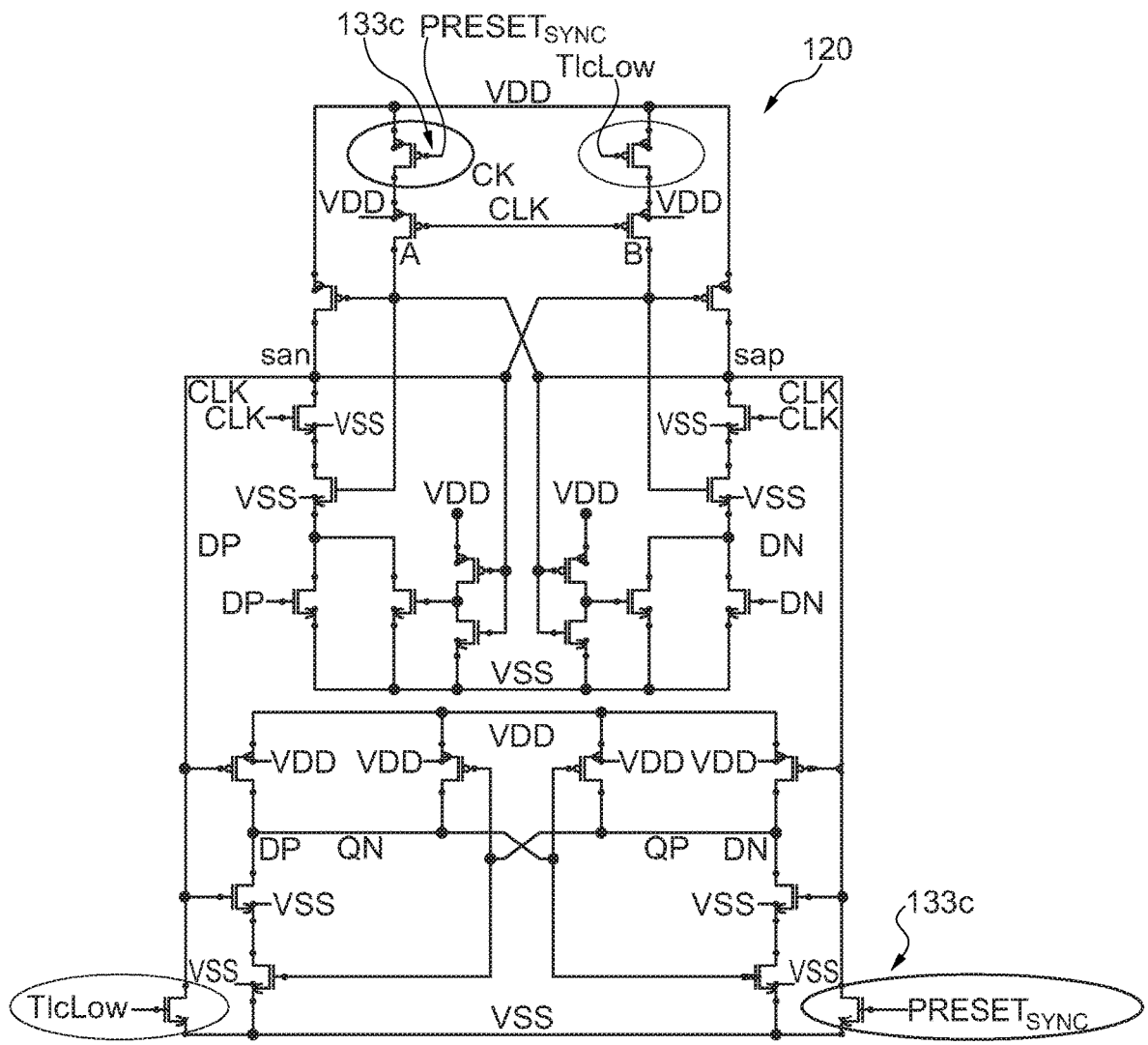
FIG. 5b illustrates a more detailed implementation of the divider device on transistor level according to an exemplary embodiment of the present disclosure.

FIG. 5b illustrates a more detailed implementation of the divider device 120 with a synchronizer device 130 according to an exemplary embodiment of the present disclosure. Specifically, there is shown an example at transistor level based on a sense-amplifier-based D-flip-flop, which is differential and perfectly symmetrical. The synchronized preset signal 133c is applied to the left upper-most transistor (see circle). Then, a pull-down nMOS forces the internal node A to the logic level low and the outputs QP to the logic level high. The right lower-most pMOS (see circle) is off, thereby ensuring that the node A can go to logic level low reliably. The logic level high on QP naturally forced a logic level low on QN (and a logic level high on internal node B). The right upper-most transistor (see circle) is optional for the preset functionality, but is used to ensure a complete symmetric design (the pMOS is always active, the nMOS is always off).

FIG. 6 illustrates the transfer function of a TDC (the phase difference of its two incoming signals is digitized) in an ideal situation (linear behavior) and in a real case, when non-idealities in the circuit cause non-linearities in the transfer function. Ensuring a highly stable zero-crossing (see also FIG. 7b) provides a transfer function that is more linear.

REFERENCE NUMERALS

100 Signal converter device
105 Incoming single-ended signal
106 Delayed incoming signal
108 XOR-gate
110 Multiplier device
115 Multiplied signal
116 Synchronized multiplied signal 120 Divider device
125 Divided differential signal
125a,b Divided differential signals
130 Synchronization device
131 Preset signal
132a First synchronization signal for differential signal
132b Second synchronization signal for multiplied signal
133a,b,c Further synchronization signals
135 Combiner, AND-gate

What is claimed is:

1. A signal converter device for converting a single-ended signal to a differential signal, the device comprising:
   a multiplier device, configured to
   receive a single-ended incoming signal, and
   multiply the incoming signal to provide a multiplied signal;
   a divider device, configured to
   receive the multiplied signal, and
   divide the multiplied signal—to provide a differential signal;
   a synchronizer device configured to
   provide a preset signal, and
   synchronize at least one of the multiplied signal and the differential signal with respect to the preset signal; and
   a combiner, coupled in between the multiplier device and the divider device;
   wherein the synchronizer device is configured to provide a synchronization signal to the combiner to generate a synchronized multiplied signal.

2. The signal converter device according to claim 1, wherein the multiplier device is configured to multiply by two or a multiple of two.

3. The signal converter device according to claim 1, wherein the divider device is configured to divide by two or the multiple of two.

4. The signal converter device according to claim 1, wherein at least one of the incoming signal and the multiplied signal is a clock signal.

5. The signal converter device according to claim 1, comprising at least one of the following features:
   wherein the multiplication is a frequency multiplication;
   wherein the division is a frequency division.

6. The signal converter device according to claim 1, wherein the multiplier device is further configured to
   provide a delayed incoming signal of the incoming signal, and
   include the delayed incoming signal in the multiplication.

7. The signal converter device according to claim 6, wherein the multiplier device further comprises an XOR-gate,
   wherein the input to the XOR-gate comprises the incoming signal and the delayed incoming signal, and
   wherein the output of the XOR-gate comprises the multiplied signal.

8. The signal converter device according to claim 1, wherein the divider device comprises a differential flip-flop circuit.

9. The signal converter device according to claim 8, wherein the differential flip-flop circuit is configured as a symmetrical differential flip-flop circuit.

10. The signal converter device according to claim 1, wherein the device is at least partially configured in CMOS.

11. The signal converter device according to claim 1, wherein the combiner comprises or consists of an AND-gate.

12. A time-to-digital converter that comprises the device according to claim 1.

13. A method of converting a single-ended signal to a differential signal, the method comprising:
    receiving, by way of a multiplier device, a single-ended incoming signal by way of a multiplier device;
    multiplying, by way of the multiplier device, the incoming signal to provide a multiplied signal;
    subsequently dividing, by way of a divider device, the multiplied signal to provide a differential signal;
    synchronizing, by way of a synchronizer, at least one of the multiplied signal and the differential signal with respect to a preset signal; and
    generating, by way of a combiner coupled in between the multiplier device and the divider device, a synchronized multiplied signal.

14. The method of claim 13, wherein multiplying the incoming signal to provide the multiplied signal includes multiplying by a factor of two.

15. The method of claim 13, wherein dividing the multiplied signal to provide the differential signal includes dividing by a factor of two.

16. The method of claim 13, wherein at least one of the incoming signal and the multiplied signal is a clock signal.

* * * * *